(12) United States Patent
Baumann (10) Patent No.: US 12,265,131 B2
(45) Date of Patent: Apr. 1, 2025

(54) CHARACTERISATION OF LITHIUM PLATING IN RECHARGEABLE BATTERIES

(71) Applicant: TWAICE Technologies GmbH, Munich (DE)

(72) Inventor: Michael Baumann, Munich (DE)

(73) Assignee: TWAICE TECHNOLOGIES GMBH, Munich (DE)

( * ) Notice: Subject to any disclaimer, the term of this patent is extended or adjusted under 35 U.S.C. 154(b) by 653 days.

(21) Appl. No.: 17/609,382

(22) PCT Filed: May 7, 2020

(86) PCT No.: PCT/EP2020/062690
§ 371 (c)(1),
(2) Date: Nov. 19, 2021

(87) PCT Pub. No.: WO2020/225356
PCT Pub. Date: Nov. 12, 2020

(65) Prior Publication Data
US 2022/0179003 A1 Jun. 9, 2022

(30) Foreign Application Priority Data
May 8, 2019 (DE) .......... 102019111958.8

(51) Int. Cl.
*G01R 31/378* (2019.01)
*G01R 31/367* (2019.01)
(Continued)

(52) U.S. Cl.
CPC ....... *G01R 31/378* (2019.01); *G01R 31/3835* (2019.01); *G01R 31/392* (2019.01);
(Continued)

(58) Field of Classification Search
CPC .............. G01R 31/378; G01R 31/3835; G01R 31/392; G01R 31/367; G01R 31/396;
(Continued)

(56) References Cited

U.S. PATENT DOCUMENTS

2013/0099794 A1* 4/2013 Takahashi ............. H01M 10/48
324/427
2017/0203654 A1 7/2017 He
(Continued)

FOREIGN PATENT DOCUMENTS

CN 101022178 A 8/2007
DE 102014200669 A1 7/2015
(Continued)

OTHER PUBLICATIONS

International Search Report from corresponding International Application No. PCT/EP2020/062690, Aug. 20, 2020, 5 pages.
(Continued)

Primary Examiner — Lisa M Caputo
Assistant Examiner — Christian T Bryant
(74) Attorney, Agent, or Firm — Tucker Ellis LLP (57) ABSTRACT

A method for characterizing a rechargeable battery (91-96) that is at risk of lithium plating comprises: receiving (1001) operating values (41) of the battery (91-96) as time-series, wherein the operating values of the battery comprise a terminal voltage of the battery (U(t)) and a battery current of the battery (I(t)), determining (1002) a simulated terminal voltage (USim(t)) using a model of the battery (400) on the basis of the battery current (I(t)), comparing (1003) the simulated terminal voltage (USim(t)) with the terminal voltage (U(t)), determining (1004, 1004a, 1004b) a lithium plating state of the battery on the basis of the comparison.

16 Claims, 7 Drawing Sheets

(51) Int. Cl.

| | | |
|---|---|---|
| *G01R 31/3835* | (2019.01) | |
| *G01R 31/392* | (2019.01) | |
| *G01R 31/396* | (2019.01) | |
| *H01M 10/052* | (2010.01) | |
| *H01M 10/0525* | (2010.01) | |
| *H01M 10/48* | (2006.01) | |

(52) U.S. Cl.
CPC ....... *H01M 10/0525* (2013.01); *H01M 10/48* (2013.01); *G01R 31/367* (2019.01); *G01R 31/396* (2019.01); *H01M 10/052* (2013.01); *H01M 2220/20* (2013.01); *Y02E 60/10* (2013.01)

(58) Field of Classification Search
CPC ............. H01M 10/0525; H01M 10/48; H01M 2220/20; H01M 10/052; Y02E 60/10
See application file for complete search history.

(56) References Cited

U.S. PATENT DOCUMENTS

| | | | |
|---|---|---|---|
| 2017/0279171 A1 | 9/2017 | Ishibashi | |
| 2018/0196107 A1* | 7/2018 | Fleischer | ............. G01R 31/367 |

FOREIGN PATENT DOCUMENTS

| | | |
|---|---|---|
| DE | 102015016987 A1 | 8/2016 |
| DE | 102017100220 A1 | 7/2017 |
| EP | 3159708 A1 | 4/2017 |
| JP | 2013072677 A | 4/2013 |
| JP | 2017198542 A | 11/2017 |
| JP | 2018077199 A | 5/2018 |
| RU | 2491566 C1 | 8/2013 |
| WO | 2011128756 A1 | 10/2011 |
| WO | 2013016188 A1 | 1/2013 |
| WO | 2018083932 A1 | 5/2018 |
| WO | 2018099168 A1 | 6/2018 |

OTHER PUBLICATIONS

Mark Verbrugge, "Adaptive, multi-parameter battery state estimator with optimized time-weighting factors," Journal of Applied Electrochemistry, vol. 37, No. 5, Feb. 21, 2007, pp. 605-616.

Gregory Plett: "Extended Kalman filtering for battery management systems on LiPB-based HEV battery packs Part 1. Background"; Journal of Power Sources, dated 2004, 10 pages.

B.V. Ratnakumar et al.: "Lithium Plating Behavior in Lithium-Ion Cells"; vol. 25, No. 36; 13 pages.

Weber, "Lecture on Battery Modeling using MATLAB, Basics of Batteries I", Institute for Applied Materials, Materials in Electrical Engineering, 38 slides.

Mark Verbrugge et al.: "Adaptive state of charge algorithm for nickel metal hydride batteries including hysteresis phenomena"; Journal of Power Sources, dated 2004, 14 pages.

Christian von Luders et al.: "Modeling of lithium plating and lithium stripping in lithium-ion batteries"; Journal of Power Sources; dated 2019, 8 pages.

Chinese Office Action from corresponding Chinese Application No. 202080031128.8 mailed on Apr. 19, 2024, 18 pages with translation.

Chinese Office Action from corresponding Chinese Application No. 202080031128.8 mailed on Nov. 14, 2024, 12 pages with translation.

Coleman, Martin, et al., State-of-Charge Determination from EMF Voltage Estimation: Using Impedance, Terminal Voltage, and Current for Lead-Acid and Lithium-Ion Batteries', IEEE Transactions on Industrial Electronics, Oct. 2007, vol. 54, No. 5, pp. 2550-2557.

Deyang, Huang, et al., "SOC Adaptive Estimation Method for Li-Ion Battery Applied in Temperature-varying Condition", Equipment Environmental Engineering, Dec. 2018, vol. 15, Issue 12, 14 pages with translation.

* cited by examiner

CHARACTERISATION OF LITHIUM PLATING IN RECHARGEABLE BATTERIES

TECHNICAL FIELD

Various examples of the invention relate to methods for characterizing a rechargeable battery. In particular, different examples of the invention relate to techniques for characterization, in order to determine a lithium plating state of the battery.

BACKGROUND

Rechargeable batteries, such as the traction batteries of electric vehicles, have a limited service life. One factor that can influence the service life of rechargeable batteries is what is known as lithium plating, which can occur in some rechargeable batteries.

Lithium plating refers here to the fact that lithium becomes deposited in metallic form at the anode of rechargeable batteries. Such a metallic deposit can have a negative influence on the properties of the rechargeable batteries. A distinction can be made between reversible and irreversible lithium plating. Lithium plating and related laboratory investigations are described in Ratnakumar V. Bugga and Marshall C. Smart, "Lithium Plating Behavior in Lithium-Ion Cells", ECS Trans. 2010 volume 25, issue 36, 241-252, doi: 10.1149/1.3393860.

The verification of lithium plating under laboratory conditions with the aid of well-defined charging cycles, or through post-mortem analyses of battery cells using complex investigation methods such as electron microscope photographs, is known. Determining the presence of lithium plating in situ is only known with substantially more complex methods such as neutron diffractometry. It is difficult, or even impossible, to carry out such verification methods during the useful operation of a battery, for example while the battery is in daily use at a customer to power a vehicle.

In addition to these physical measurements, there are methods with which lithium plating can be verified on the basis of characteristic voltage plateaus that occur after a charging phase as a result of the subsequent oxidation of lithium.

Such voltage anomalies can be relatively easily recognized during the relaxation phase or during a constant-current discharge. These plateaus, however, disappear if the battery discharge takes place dynamically. Such measurements are therefore only of limited value for verifying lithium plating during ongoing operation, i.e. in the real use of a field unit of a battery.

SHORT DESCRIPTION OF THE INVENTION

There is therefore the need for other options for the diagnosis of lithium plating. There is, in particular, a need for possibilities for the detection of lithium plating in real applications that are overlaid by dynamic factors.

This object is achieved by the features of the independent patent claims. The features of the dependent patent claims define exemplary embodiments.

A method is provided for characterizing a rechargeable battery that is at risk of lithium plating. The method comprises:
receiving operating values of the battery, wherein the operating values of the battery comprise a terminal voltage of the battery and a battery current of the battery.

The operating values can, for example, be received as time-series. One alternative would be for the operating values to be received as aggregated data. Histograms can, for example, be used.

The method further comprises:
determining a simulated terminal voltage using a model of the battery on the basis of the battery current,
comparing the simulated terminal voltage with the terminal voltage,
determining a lithium plating state of the battery on the basis of the comparison.

The comparison can be made on the basis of instantaneous voltage values of the terminal voltage and of the simulated terminal voltage. It would furthermore be possible for the determination of the simulated terminal voltage to comprise the integration of the simulated terminal voltages over a specified range, whereby a simulated surface results. The simulated surface can be compared with a surface that results from the integration of the terminal voltages over the specified range. This means that the comparison can be based on integrals over voltage values. The lithium plating state of the battery can be determined from the comparison of the simulated surface and of the surface that results from the operating values of the battery.

A time-series refers here to a temporal sequence of data that can, for example, be determined by a series of measurements made at different times. The temporal sequence can here be formed continuously, or it can also be possible for the temporal sequence to be irregular.

A computer program or a computer program product, or a computer-readable storage medium, comprises program code. This program code can be loaded and executed by a processor. This has the effect that the processor carries out a method for characterizing a rechargeable battery in accordance with one of the described methods. The method can be carried out here on the server side.

A system is furthermore provided. The system comprises: at least one device with a battery, wherein the device is configured to transmit operating values to a server, wherein the operating values comprise
a terminal voltage of the battery, for example as a time-series, and a battery current of the battery, for example as a time-series.

The system further comprises a server. The server is configured to receive the operating values of the at least one device and to carry out the method described here with them.

The at least one device can be a vehicle.

A server is further provided. The server is configured to receive operating values of a battery, for example as a time-series, and to carry out the method described here with them.

The features presented above, and features that are described below, can be used not only with the corresponding combinations explicitly presented, but also in other combinations, or in isolation, without leaving the protective scope of the present invention.

DETAILED DESCRIPTION OF EXEMPLARY EMBODIMENTS

The properties, features and advantages of this invention, described above, as well as the manner in which they are achieved, will be understood with greater clarity in connection with the following description of the exemplary embodiments, which are explained in more detail in association with the drawings.

The present invention is explained in more detail below in terms of preferred exemplary embodiments and with reference to the drawings. The same reference signs identify identical or similar elements in the figures. The figures are schematic representations of various exemplary embodiments of the invention. Elements illustrated in the figures are not necessarily represented true-to-scale. Rather are the various elements illustrated in the figures reproduced in such a way that their function and general purpose will be understandable to the expert. Connections and couplings between functional units and elements illustrated in the figures can also be implemented as indirect connections or couplings. A connection or coupling can be implemented in wired or wireless form. Functional units can be implemented as hardware, software, or a combination of hardware and software.

Techniques are described below in connection with characterizing of rechargeable batteries. The techniques described herein can be employed in connection with very different types of rechargeable battery in which lithium plating can occur, for example in association with batteries based on lithium ions such as lithium-nickel-manganese-cobalt oxide batteries, or lithium-manganese oxide batteries.

The rechargeable batteries described here can be employed in a wide variety of application fields. The batteries can, for example, be used in devices such as motor vehicles or drones, or in portable electronic devices such as mobile telephones. It is also conceivable to employ the batteries described herein in the form of stationary energy stores. The methods described herein can be carried out on the server side. Alternatively or in addition, for example partially the methods can, however, also be carried out by the device itself, for example by a battery management system of a device. All the steps can here be carried out by the device. Alternatively, parts of steps or entire steps can be carried out by an additional remote device, for example a server.

The lithium plating state ascertained can be used in various ways. For example, a result of the lithium plating state can be employed in order to adjust the operation of the battery. In this way, for example, an excessive ageing of the battery could be avoided. Alternatively or in addition, a second use of the battery could also be ascertained on the basis of the result of the lithium plating state. It would be possible, for example, to determine whether the battery is still suitable for a particular use, or whether it needs to be withdrawn from use. A further possibility for the application relates to targeted servicing and/or refurbishment of batteries depending on the lithium plating state. It would, for example, be possible to service or exchange etc. batteries for which a deteriorated lithium plating state is predicted.

As a general rule, the techniques described herein for determining the lithium plating state can be employed on various levels: in a simple implementation, the determination of the lithium plating state can take place on the battery level, meaning that a determination can take place right across all the battery blocks and cells of the battery. In further examples, however, it would also be possible that the determination is resolved down to different battery blocks or even cells of individual battery blocks, for example for series-connected and/or parallel-connected battery blocks. It can sometimes be possible for a battery to be dismantled and for individual battery blocks to be disposed of, while other battery blocks continue to be used. In such an example, an individual determination on the battery block level, even in advance, can be desirable. This too can be possible with the methods and devices described here.

Several of the examples described herein can be implemented at least partially on the server side. This means that at least a part of the logic associated with the methods and devices described here can be carried out on a central server or on a plurality of distributed servers (also referred to below as a server), separately from the battery or the battery-driven device. The server can, in other words, be a single computer system. The server can also be implemented in a distributed manner over various computer systems, for example as what is known as cloud computing.

A communication connection can in particular be established for this purpose between the server and the one or plurality of battery management systems of the battery. By implementing at least part of the logic on the server, particularly accurate and computing-intensive models and/or simulations can be applied in association with the lithium plating state determination. This makes it possible to carry out the state determination particularly accurately. It can, in addition, be possible to collect and evaluate data for an ensemble of batteries, for example in connection with machine-learnt models.

Various examples described herein can carry out the state determination during the use of the battery on the basis of measured data from the battery. This means that the lithium plating state of the battery can be determined, in particular for a specific time point during the service life of the battery. The battery can also be in use in the field at this time. In this way it can in particular be possible to also take the previous lithium plating behavior of the battery into consideration.

Figure 1:
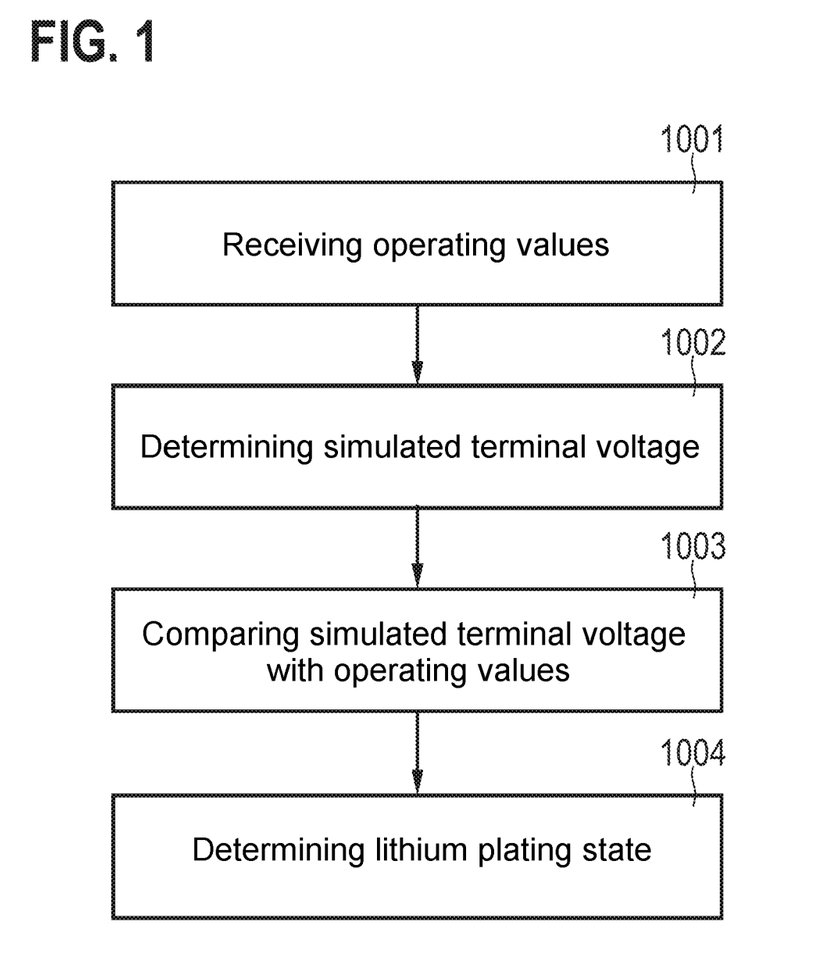
FIG. 1 shows a method according to various exemplary embodiments.

FIG. 1 shows a method according to various exemplary embodiments.

The method can be applied for characterization, for example a server-side characterization, of a rechargeable battery that can be at risk of lithium plating. The method of FIG. 1 can, for example, be carried out by the system 80 of FIG. 2. Reference is made below to the devices of FIG. 2. In other examples, however, the method can also be carried out in another way than with the system of FIG. 2. These examples are therefore not to be considered as restrictive.

The method comprises the following steps:

In 1001, operating values 41 of the battery, for example one of the batteries 91-96, are received as time-series. The operating values of the battery can here, for example, include a terminal voltage of the battery and/or a battery current of the battery.

The terminal voltage and the battery current can be ascertained during a discharging procedure and/or a charging procedure of the battery. The terminal voltage and the battery current can also be ascertained over combined charging and discharging procedures, for example over one charging and one discharging procedure. Respective procedures can also be only partially carried out, for example be a partial charging procedure.

Figure 2:
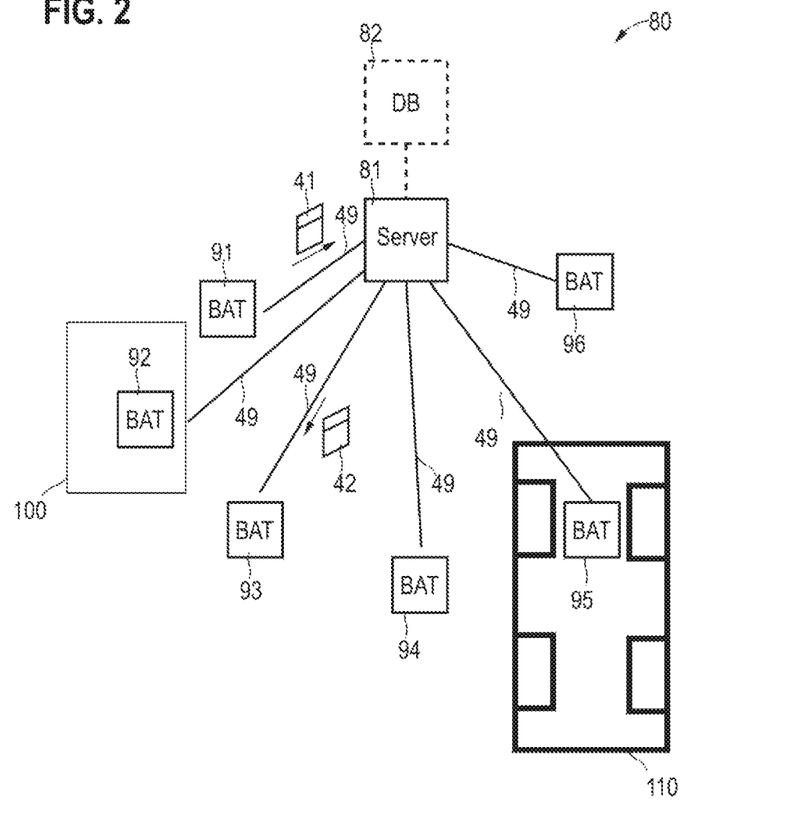
FIG. 2 shows a system according to various exemplary embodiments.

A charging procedure here can, for example, be charging the battery at an external source of current, while a (partial) charging procedure can, however, also be carried out by other processes of energy supply, for example recovery in a vehicle 110 of FIG. 2.

The ascertainment can take place here during use of the battery, i.e., for example, while a vehicle is being used with the battery (sometimes also known as "field use").

A determination of a simulated terminal voltage USim(t) takes place at 1002 with a model of the battery.

The model of the battery can, for example, be one of the models described below in connection with FIG. 8 and FIG. 9. The determination of the simulated terminal voltage can here take place on the basis of the battery current I(t).

A comparison of the simulated terminal voltage USim(t) with the terminal voltage U(t) takes place at 1003.

The comparison can further comprise the determination of a voltage-charge curve on the basis of the terminal voltage U(t) and the battery current I(t).

Figure 10:
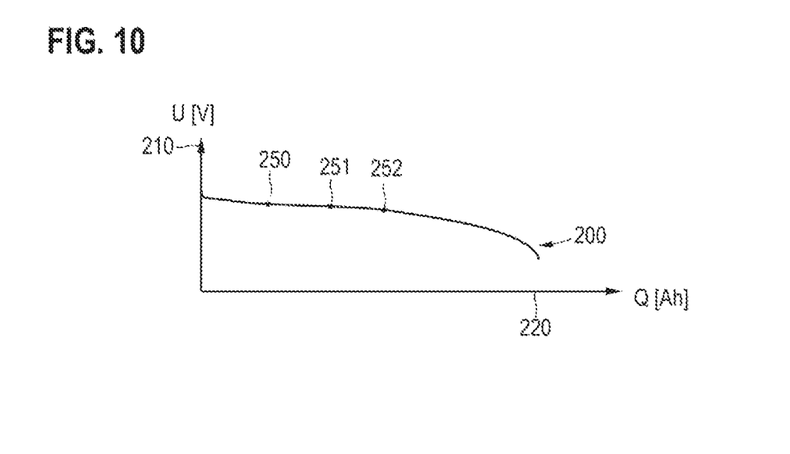
FIG. 10, FIG. 11 and FIG. 12 show examples of various voltage-charge curves.
Figure 11:
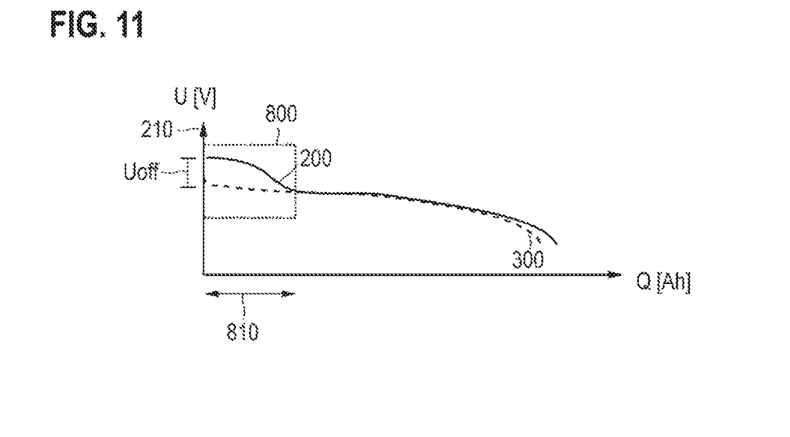
Figure 12:
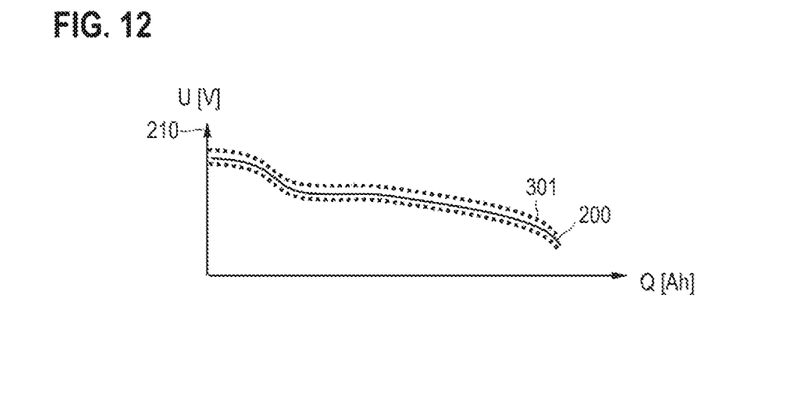

Examples of voltage-charge curves 200 are shown in FIGS. 10 to FIG. 12 and explained in more detail below.

A voltage-charge curve 200 can be used in order to compare simulated terminal voltages with selected regions of the voltage-charge curve 200. A voltage-charge curve can be an example of the aggregated data mentioned earlier. A given voltage-charge curve can, in particular, not have a dependency on time. For example, a simulated terminal voltage for a predefined charge state, for example 90%, can be determined. This can then be compared directly with the corresponding value of the ascertained voltage-charge curve 200. In other words, the modelling of the voltage-charge curve 200 can in some examples only take place for a single point. In other examples, multiple points of the voltage-charge curve can also be determined and/or simulated.

The comparison can further comprise the determination of a simulated voltage-charge curve 300 on the basis of the simulated terminal voltage (USim(t)) and the battery current.

The method can further comprise the comparison of the voltage-charge curve 200 with the simulated voltage-charge curve 300.

Such variants of the comparison can have the advantage that techniques for characterizing lithium plating that presuppose the presence of voltage-charge curves, for example obtained from laboratory measurements, can be made use of for the comparison of specified and simulated voltage-charge curves.

Instead of comparing of the voltage-charge curve 200 with the simulated voltage-charge curve 300, it is also possible as an alternative to calculate the difference between the two curves at 1003. The integration of the difference of the two curves results in a characteristic surface. This surface can in turn be compared with a reference surface in order to achieve a determination of a lithium plating state at 1004. Through such a comparison which takes integrated voltage values into consideration, a particularly high accuracy—which compensates, for example, for short temporal fluctuations—can be achieved.

Other variants of the comparison of aggregated data can also be carried out. Histograms of, for example, charge and discharge states can also, for example, be determined, and compared with simulated histograms. Such a procedure can have the advantage that the quantity of the data to be acquired by, for example, the device 100, can be reduced and/or the quantity of data to be transmitted can be reduced. The quantity of data that has to be transmitted over the communication connections 49 can, for example, be reduced in this way. Corresponding considerations also apply to the data of simulations, whose results can be stored, processed and transmitted with a smaller quantity of data.

The comparison of the simulated terminal voltage with the terminal voltage can be based on a voltage offset between the simulated terminal voltage and the terminal voltage. This is described below in connection with FIG. 11.

In addition, or as an alternative, the simulated terminal voltage can be based on a voltage offset. This is described below in connection with FIG. 12.

A determination of a lithium plating state of the battery takes place at 1004 on the basis of the comparison at 1003.

The determination of the lithium plating state can be quantified on the basis of a width 810 of a plateau 800 of the voltage-charge curve, wherein the plateau 800 is determined on the basis of the voltage offset Uoff. This is shown by way of example in FIGS. 11 and FIG. 12

FIG. 2 shows a system according to various exemplary embodiments.

A system 80 is shown in the exemplary embodiment of FIG. 2.

In one example, the system 80 can comprise at least one vehicle, for example the vehicle 110, with a battery, for example the battery 95. Other devices, for example the device 100 of FIG. 2, can however also be an alternative or additional system component. The vehicle 110 can be configured to transmit operating values to the server 81. The operating values can here comprise a terminal voltage of the battery as a time-series and/or a battery current of the battery as a time-series. The server 81 can be configured to receive the operating values of the at least one vehicle 110, for example via communication connections 49, and thereby to carry out at least one of the methods described here.

In a further example, which can be combined with the previous example, but which can also be implemented independently thereof, the server 81 is configured to receive operating values 41 via respective communication connections 49. The operating values 41 can here in particular be the operating values that are used in the exemplary embodiment of the method described here, for example the method of FIG. 1.

Figure 4:
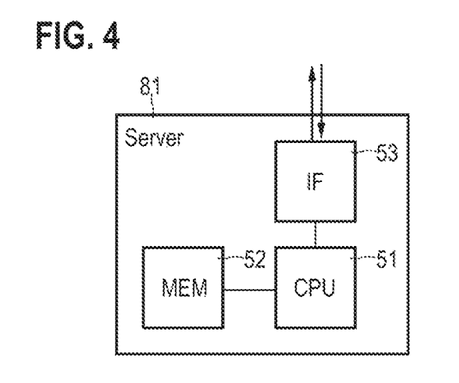
FIG. 4 shows an example of a server.
Figure 7:
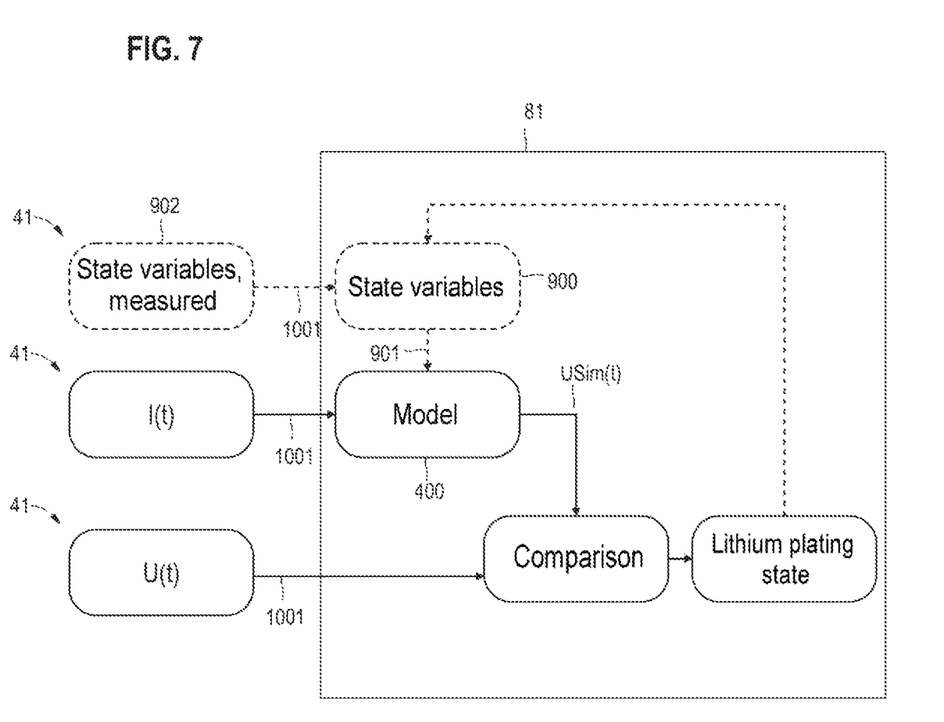
FIG. 7 shows a possible implementation of the method of FIG. 1.

The server 81 can, for example be the server 81 of FIG. 4 and/or of FIG. 7.

The operating values 41 can be provided by different batteries 91 to 96. The batteries can here be installed in different devices. The battery 92 is, for example, installed in a device 100. The battery 95 is installed in a vehicle 110.

FIG. 2 also illustrates by way of example that the server 81 can transmit control data 42 to the batteries 91 to 96 via the communication connections 49. It would, for example, be possible for the control data 42 to indicate one or a plurality of operating limits for the future operation of the respective battery 91 to 96. The control data could, for example, indicate one or a plurality of control parameters for a thermal management of the respective battery 91 to 96 and/or a charge management of the respective battery 91 to 96. By using the control data 42, the server 81 can thus in some exemplary embodiments influence or control the operation of the batteries 91 to 96. The state of the lithium plating determined in the method of FIG. 1 can, for example, be used here to determine control data 42 for the respective battery. A progress of the lithium plating can, for example, be reduced in this way or even avoided, for example in that permissible maximum charging currents are defined, for example as a function of a temperature of the battery.

Figure 3:
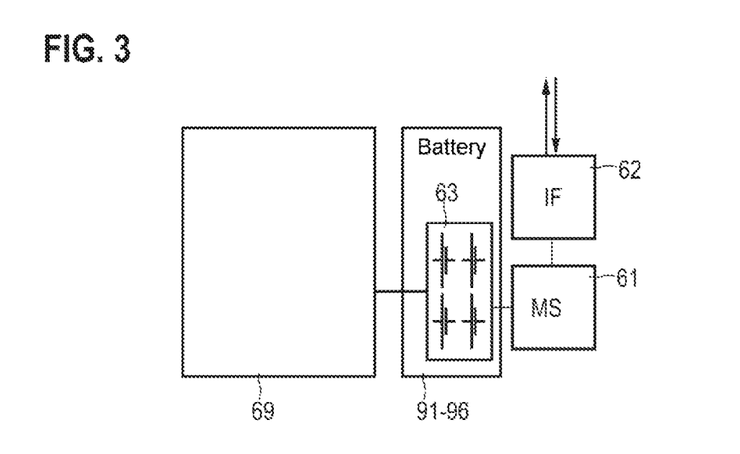
FIG. 3 shows an example of a battery that supplies a device.

FIG. 3 shows an example of a battery that supplies a device.

Further possible components of the batteries 92 to 96 illustrated schematically in FIG. 2 are shown in FIG. 3. The illustrated batteries 91 to 96 can, for example, be the battery 92 of FIG. 2. The batteries 91 to 96 can here supply a device 69 with electrical energy. The device 69 shown in FIG. 3 can, for example, be the device 100 of FIG. 2 or the vehicle 110 of FIG. 2.

The batteries 91-96 can comprise a plurality of battery blocks 63. Each battery block 63 typically comprises a number of battery cells connected in parallel and/or serially. Electrical energy can be stored there. The behavior of the batteries 91-96 is controlled by a battery management system 61 or by a plurality of battery management systems. The battery management system 61 can, for example, be what is known as a BMS or another control logic such as an on-board unit in the case of a vehicle. The battery management system 61 can, for example, be implemented by software on a processor.

Alternatively or in addition, an application-specific circuit (ASIC) or a field-programmable gate array (FPGA) could for example be used. An implementation of the battery management system 61 at least partially in a cloud is also possible.

The batteries 91-96 could, for example, communicate with the battery management system 61 by means of a bus system. The batteries 91-96 could also comprise a communication interface 62. The battery management system 61 can establish a communication connection 49 with the server 81 via the communication interface 62. The communication interface 62 can be configured to transmit operating values 41 to the server 81. The communication interface 62 can, further, be configured to receive control data, for example the control data 42 of FIG. 2. In such examples, the battery management system 61 can be configured to adapt a control and/or regulation behavior on the basis of the control data 42.

While the battery management system 61 is drawn in FIG. 3 separately from the batteries 91 to 96, it is also possible that the battery management system 61 in other examples is a part of the batteries 91 to 96. Corresponding considerations apply to the communication interface 62.

The battery management system 61 can typically make use of one or a plurality of sensors in the one or a plurality of battery blocks 63. In some examples, the battery management system 61 can in addition or alternatively make use of further sensor data. The sensors can, for example, measure the flow of current and/or the voltage in at least some of the battery cells. The voltage here can be determined both under no-load conditions, sometimes also referred to as the open circuit voltage (OCD), or also when under load, sometimes referred to as the terminal voltage. Alternatively or in addition, the sensors can also measure other variables in connection with at least some of the battery cells, for example the temperature, volume, pressure, etc. The battery management system 61 can be configured to determine current state variables for the respective batteries 91 to 96 or, optionally, also for individual battery blocks, on the basis of one or a plurality of such measured values from sensors. In cases in which further data are present, these can also be transmitted to the server 81 of FIG. 2 via the communication interface 62. This can, for example, make it possible to carry out the method of FIG. 1 also on other levels, for example on the level of individual cells connected in parallel, if, for example, the terminal voltage is ascertained in common for the parallel-connected cells. As a result it can, for example, be possible to determine a lithium plating state not only for the battery 91 to 96 as a whole, but for subsidiary levels of the battery 91 to 96.

FIG. 4 shows an example of a server.

The server 81 shown by way of example in FIG. 4 comprises a processor 51 and a memory 52. The memory 52 can comprise a volatile memory element and/or a nonvolatile memory element. Furthermore, the server 81 also comprises a communication interface 53. The processor 51 can establish a communication connection 49 with each of the batteries 91 to 96 and, optionally, with the database 82, via the communication interface 53.

Program code can, for example, be stored in the memory 52 and loaded by the processor 51. The processor 51 can then execute the program code. The execution of the program code can have the effect that the processor 51 executes one or a plurality of the methods such as are described in detail herein in connection with the various examples.

A computer program can, according to the invention, be provided with program code. This, when it is executed on a processor, for example the processor 51, can have the effect that one of the methods described here is carried out.

As explained previously, the server 81 can also be a logical unit and be realized, for example, as a virtual server or as a cloud server.

Figure 5:
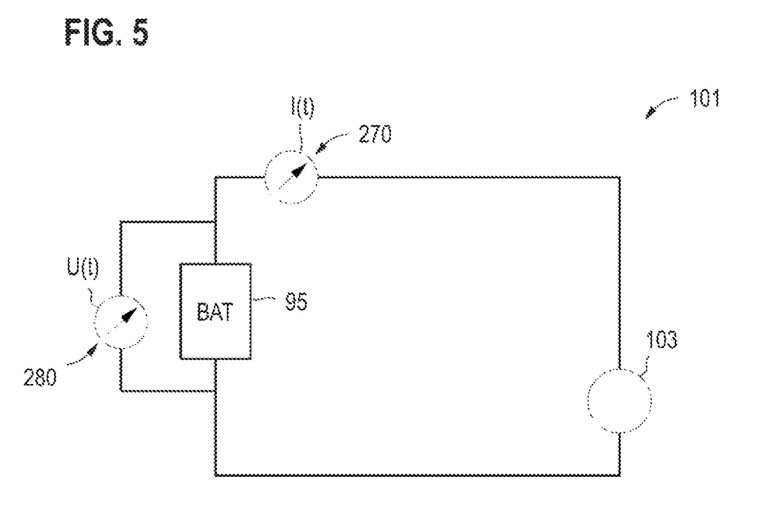
FIG. 5 shows an example of an electric circuit comprising a rechargeable battery.

FIG. 5 shows an example of an electric circuit comprising a rechargeable battery.

A schematic equivalent circuit for a circuit 101 comprising a battery 95 is shown in FIG. 5. The circuit 101 can, for example, be installed in the vehicle 110 of FIG. 2, or in another device, for example the device 100 of FIG. 2.

Operating values 41 of the battery 95 shown in the illustrated example are determined as a time-series, as described below. In other examples, different operating values and/or alternative operating values can be acquired. The battery 95 can, for example, be the battery 95 of FIG. 1 that can be installed in a vehicle 110. It can, however, also be another battery. In the schematically illustrated example, the battery 95 is coupled to a consumer 103. The consumer 103 can, for example, be the drive train of an electric vehicle. A controller that regulates the load behavior of the consumer 103 is not shown in the schematic illustration 101. This can be an element of the consumer 103 itself.

The battery 95 provides a current $I(t)$ in response to the load behavior of the consumer 103. This current can be measured by a current measuring instrument 270. A terminal voltage $U(t)$, which also depends on the load behavior of the consumer 103 and the characteristic of the battery 95, for example the charge state and/or other state variables of the battery 95, is present at the battery 95. This terminal voltage $U(t)$ can be acquired by a second measuring instrument 280.

The terminal voltage $U(t)$ and the battery current $I(t)$ can be measured by the measuring instruments 270, 280 as a function of the time for at least two different time points. Time-series of these operating values can be acquired hereby. This can, for example, be done by the battery management system 61 of FIG. 3, but other implementations are also possible. The time-series of the operating values acquired in this way can then be transmitted to the server 81 of FIG. 2, for example via the communication connections 49 of FIG. 2. In other exemplary embodiments it is also possible for the operating values initially to be stored locally and for the communication connections 49 of FIG. 2 to be established during, for example, servicing work, for example in a workshop, for example when a connection to a diagnostic port of the vehicle 110 or the device 100 of FIG. 2 is established. In such cases, the time-series can, for example, be stored by the battery management system 61, but other possibilities also exist.

Figure 6:
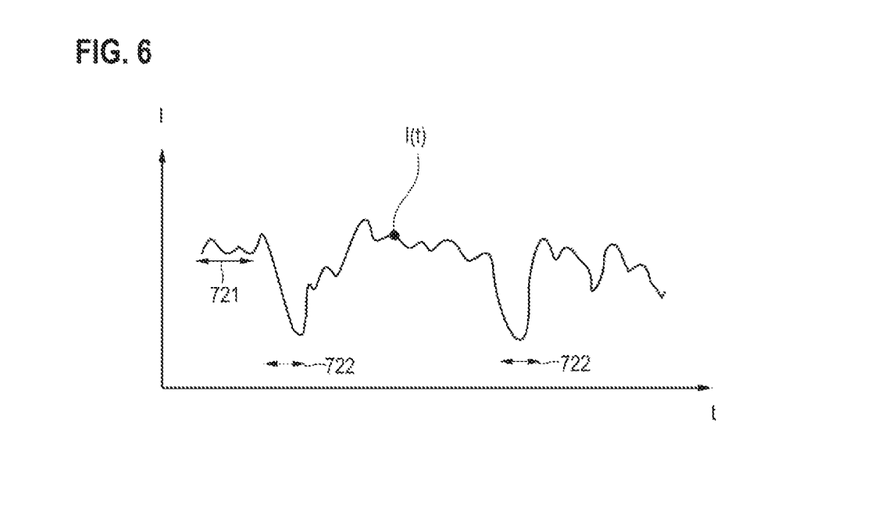
FIG. 6 shows an example of a time-series of the battery current of the battery.

FIG. 6 shows an example a time-series of the battery current of the battery.

FIG. 6 shows a battery current I(t) that flows from a battery, for example the battery 95 of FIG. 5, in response to a load profile of a consumer, for example the consumer 103 of FIG. 5. In the example illustrated in FIG. 6, the battery current I(t) is positive. Phases with a relatively constant current demand profile 721 alternate with phases in which the current demand profile 722 changes strongly over time. A positive current can indicate that the battery is being discharged. In other examples, the battery current I(t) can also be acquired while the battery is being charged, for example during a charging procedure, or during other processes, for example recovery during the operation of the vehicle. In such cases, the curve I(t) would be negative following the convention of FIG. 6. The charge that has flowed can, for example, be ascertained through integration over time of the time-series of the battery current I(t). The charge that has flowed can then be used to determine the voltage-charge curve. This is described below in connection with the figures FIG. 10-FIG. 12.

Initially, however, a possible further procedure with the operating values of the battery as a time-series determined in this way is described with reference to FIG. 7.

FIG. 7 shows a possible implementation of the method of FIG. 1.

FIG. 7 shows possible sequences that may be carried out within the server 81 in order to implement the method of FIG. 1. The server 81 can, for example be the server 81 of FIG. 4.

To carry out one of the methods described here, the server 81 receives 1001 operating values 41 of a battery. The battery 81 can, for example be the battery 95 of FIG. 5 and/or of FIG. 6. The terminal voltage of the battery as a time-series U(t) and a battery current of the battery as a time-series I(t) can, for example, be provided as operating values 41.

By means of a model 400, the server 81 determines a simulated terminal voltage USim(t) on the basis of the battery current I(t). In a further step, a comparison 1003 of the simulated terminal voltage USim(t) with the terminal voltage U(t) takes place. A determination 1004 of the lithium plating state of the battery takes place on the basis of the comparison 1003. The lithium plating state of the battery can be stored by the server 81 at 1004 and/or provided to other applications, for example placed in the database 82 of FIG. 1, or used in other processes to provide control data 42 for the respective battery.

In some exemplary embodiments, control data 42 for a second battery can also be provided on the basis of the lithium plating state determined for a first battery. If, for example, lithium plating occurs in the first battery when discharged quickly at a low battery temperature, control data 42 can be provided for other similar or structurally identical batteries, for example a second battery that can, for example, be installed in a comparable series vehicle to the first battery, preventing lithium plating of this second battery.

In some exemplary embodiments, the lithium plating state 1004 can also be used to ascertain state variables 900. The state variables 900 can, as suggested at 901, be taken into consideration in the model 400.

In some exemplary embodiments, one or a plurality of state variables 900 of the battery can additionally be provided to the server 81. The state variables 900 can here, for example, be the temperature of the surroundings of the battery, a temperature of the battery, a charge state, sometimes also referred to as the state of charge, SOC, an ageing state of the battery, an event history of the battery and/or a current rate of a load of the battery. Other state variables 900 are, however, also possible. The current rate of the load of the battery can here be the current of the battery demanded from the battery. The current can be normalized to a rated capacity of the battery.

The state variables 900 can be provided by further models, for example ascertained on the basis of the time-series of the terminal voltage U)t) and/or the time-series of the battery current I(t). Alternatively or in addition, the state variables can also be determined on the basis of measured state variables 902. A temperature 902 can, for example, be measured directly in a battery cell, and, after transmission to the server 81, can be used directly as a state variable 900. In other examples, a local temperature of the battery can be simulated for example on the basis of a measured external temperature of a vehicle 902 and the time-series of the battery current I(t) and/or the terminal voltage U(t), for example by means of a thermal simulation and, on this basis, a temperature of the battery cell can, for example, be provided as a function of time as a state variable 900.

The temperature of the surroundings of the battery can, for example, also be ascertained with reference to weather data, for example on the basis of position measurements of the battery, for example using GPS measurements of a vehicle with a battery. Such state variables 902 can thus also be determined by the server 81 itself, for example by calling up weather models for GPS coordinates. The temperature of the battery can, for example, be acquired through measurements, for example by measurements taken by the battery management system with a temperature sensor.

The model 400 can depend on at least one state variable 900. For example, at least one element, for example a structural element, of the model of the battery as is, for example, shown in FIG. 8 and FIG. 9, for example the voltage source UOC and/or the RC network 420 can for example depend on at least one state variable.

Figure 8:
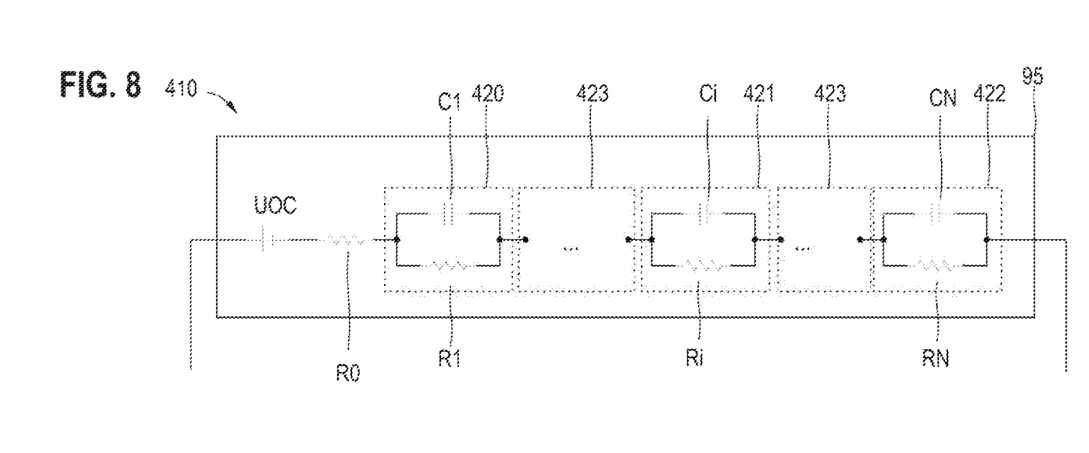
FIG. 8 shows an equivalent circuit that can be used to model a battery, wherein the model does not simulate lithium plating.
Figure 9:
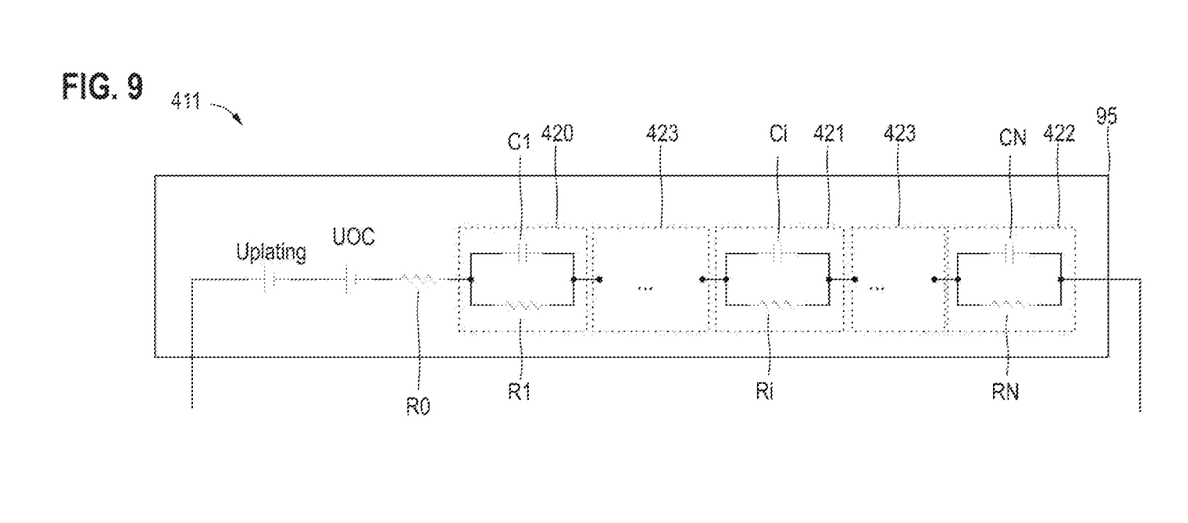
FIG. 9 shows an equivalent circuit of a battery that can be used to model a battery, wherein the model does simulate lithium plating.

FIGS. 8 and 9 show examples of battery models.

FIG. 8 shows an equivalent circuit 410 that can be used to model a battery 95, wherein the model does not simulate lithium plating.

FIG. 9 shows a further equivalent circuit 411 of a battery that can be used to model a battery 95, wherein the model does simulate lithium plating.

The equivalent circuits 410, 411 can be used to provide the model 400 of FIG. 7.

The equivalent circuits 410, 411 each comprise a voltage source UOC and a resistor R0. In the illustrated examples of the equivalent circuits 410, 411, at least one RC network is additionally present in each case, for example a plurality of RC networks 420 to 423. The at least one RC network can, for example, comprise a first RC network and a second RC network, wherein the at least one resistor and the first RC network and the second RC network can each be connected in series with one another. The first and the second RC network can in addition be connected in series with the ideal voltage source. On the other hand, in some exemplary embodiments—not shown in FIG. 8 and FIG. 9—an RC network is not present.

In the example shown in FIG. 8 and FIG. 9, each of the RC networks 420 to 423 comprises a resistor and a capacitor that are each connected in parallel with one another. The RC network 420 thus comprises a first resistor R1 and the first capacitor C1. The i-th network 421 comprises a resistor Ri and a capacitor Ci, and the n-th RC network 422 comprises a resistor Rn and a capacitor Cn. The points between the RC networks indicate that further RC networks 423 can optionally be present.

Through such equivalent circuits as the shown equivalent circuits 410, 411, but also through equivalent circuits that comprise fewer components than those shown in the examples or that comprise additional further components, it is possible to simulate a load behavior of the battery 95 that is dynamic in time.

The voltage source UOC can be an ideal voltage source. This can, for example, be parameterized as a function of a charge state of the battery 95. In other examples, the UOC can have further properties. These properties can, for example, be parameterized as a function of state variables, for example of the state variables 900 of FIG. 7. A temperature dependency of the voltage source UOC can, for example, be parameterized.

The illustrated equivalent circuits 410, 411 can contain further elements in some examples. Further properties of the batteries can, for example, hereby be simulated. In other examples, the equivalent circuits 410, 411 do not contain any further elements or, as described above, contain fewer elements. In one example, an equivalent circuit comprises a resistor R0 and an ideal voltage source UOC.

A particularly efficient simulation, which can be calculated with less effort and at the same time be accurate enough for some tasks, can be achieved through equivalent circuits with fewer elements.

In some examples with at least one RC network, 10 RC networks are used, in some examples 8 RC networks, in some examples 6 RC networks, and in some examples 4 RC networks. A different number of RC networks is also, however, possible.

A further voltage source, UPlating, is present in the equivalent circuit 411 of FIG. 9. The equivalent circuit 411 of FIG. 9 is also to be understood as exemplary and can, as explained in connection with FIG. 8, comprise fewer or more components than in the illustrated example.

The further voltage source UPlating can be used to be able to represent a change in the voltage arising from lithium plating processes using the model 411.

The respective components of the equivalent circuits 410, 411 can be adapted on the basis of the at least one state variable 900 of the battery. The i-th resistor Ri and the i-th capacitor Ci can, for example, be varied in response to a temperature of the battery. This can, for example, be technically realized by means of a lookup table. Other methods, such as functional descriptions of the dimensioning of, for example, the capacitor Cn as a function of a state variable, for example of the external air pressure, can, however, also be carried out.

The equivalent circuits, for example the equivalent circuits 410, 411 shown in FIG. 8 and FIG. 9, can, in addition or alternatively, include a hysteresis element. The hysteresis element can be configured to model a hysteresis behavior of the battery.

Various models for modelling hysteresis behaviors are in themselves known, for example the zero-state and one-state hysteresis model, as is, for example, described in Plett, G. L.: Extended Kalman filtering for battery management systems of LiPB-based HEV battery packs, Journal of Power Sources 134 (2004), No. 2, S. 252-261. Models are also known from Verbrugge et al., as are described, for example, in Verbrugge, M., Tate, E.: Adaptive state of charge algorithm for nickel metal hydride batteries including hysteresis phenomena, Journal of Power Sources 126 (2004), 1-2, pp. 236-249 and Verbrugge, M.: Adaptive, multi-parameter battery state estimator with optimized time-weighting factors, Journal of Applied Electrochemistry 37 (2007), No. 5, pp. 605-616.

Such models, implemented, for example, in the form of an additional element in the equivalent circuit, can be used to configure the model of the battery 400 in such a way that a hysteresis behavior of the battery, for example when changing from a charging procedure to a discharging procedure, is simulated.

The use of these or of other hysteresis models, including in combination with the equivalent circuits described here, is also possible.

FIG. 10, FIG. 11 and FIG. 12 show examples of various voltage-charge curves.

An exemplary voltage-charge curve 200 is shown in FIG. 10. In the chosen coordinate system, the charging is plotted in ampere-hours on the x-axis 220, and the voltage, in volts, on the y-axis 210. The voltage-charge curve 200 shown can be ascertained on the basis of the terminal voltage U(t) and the battery current I(t). This is indicated by the points 250, 251, 252. The voltage-charge curve 200 can be composed of a large number of such points. The y-coordinate the point 250 can, for example, be ascertained, for a given time T, from the terminal voltage of the battery as the time-series (t), wherein y can be equal to U(t=T). The x-coordinates of the point 250 can, for example, be ascertained through the integration over time of the battery current of the battery as a time-series I(t). The charge that has flowed can, for example, be determined through the integration over time of the curve for the predefined time point T shown in FIG. 6. Assumptions can be made here in regard to the integration limits. It can, for example, be assumed that at one time point, t=T0, the battery is fully charged, and that the charge that has flowed can be set as Q=0 ampere-hours. In other examples, the integration constant can be determined on the basis of further models, for example for the charge state and/or the ageing state. A lithium plating state determined previously, i.e. for example in a previous charge/discharge cycle, can also be used to determine the integration constant.

The voltage-charge curve 200 shown in FIG. 10 is an exemplary voltage-charge curve for a battery that does not have any lithium plating.

FIG. 11 shows a voltage-charge curve 200 of a battery with lithium plating. This can be clearly seen in particular in the region 810, where the formation of a plateau in the voltage-charge diagram can be seen. The voltage-charge curve 200 can be compared to a simulated voltage-charge curve 300. In the illustrated example, the voltage-charge curve 200 has a voltage offset Uoff with respect to the simulated voltage charge curve 300. The voltage offset Uoff can here be indicative of lithium plating.

The determination of the lithium plating state can be quantified on the basis of the width 810 of the plateau 800 of the voltage-charge curve 200. The plateau 800 can, in addition or alternatively, be determined on the basis of the voltage offset Uoff.

An expected mathematical function can, for example, be used to characterize the plateau 800, for example by means of a function that includes a tanh function. Other functions are, however, also possible.

The voltage offset Uoff can lie between 50 mV and 150 mV, in particular between 80 mV and 120 mV.

The voltage offset can be the result of electrochemical voltage series, and can, for example, result from the different oxidation potentials of metallic and deintercalated material. It is, for example, known from Ratnakumar V. Bugga and Marshall C. Smart, "Lithium Plating Behavior in Lithium-Ion Cells", ECS Trans. 2010 volume 25, issue 36, 241-252, doi: 10.1149/1.3393860, that oxidation potentials for metallic lithium are about 100 mV higher than is the case with deintercalation. A voltage offset Uoff of about 100 mV, for example 100 mV, can be chosen for such systems. Corresponding numerical values can be calculated for other systems.

The voltage offset Uoff can, for example, be used as a parameter of the tanh function.

The simulated voltage-charge curve 300 can be ascertained on the basis of the simulated terminal voltage USim(t) and the battery current I(t). The presence of lithium plating in the battery can then be ascertained from a comparison of the voltage-charge curve 200 with the simulated voltage-charge curve 300. The simulated voltage-charge curve 300 can, for example, be ascertained by means of the equivalent circuit 410 of FIG. 8. Since the simulated voltage-charge curve 300 does not take lithium plating into consideration, it can be concluded from the discrepancy between the simulated voltage-charge curve 300 and the measured voltage-charge curve 200, for example in the region 800, that lithium plating has occurred in the battery. In a different case, for example in the presence of the voltage-charge curve 200 shown in FIG. 10 the simulated voltage-charge curve 300 would be in accord, within the limits of error, with the measured voltage-charge curve 200 of FIG. 10. On this basis it is possible in such a case to determine that no lithium plating is present.

FIG. 12 shows the voltage-charge curve 200 of FIG. 11, but a different simulated voltage-charge curve 301. The simulated voltage-charge curve 301 shown in FIG. 12 can have been determined, for example on the basis of a model that can include the equivalent circuit 411 of FIG. 9.

Since the equivalent circuit 411 comprises a voltage source UPlating, it can be possible that the simulated voltage-charge curve 301 is also in accord with the profile of the determined voltage-charge curve 200 in the region 800. Thus in this case, because a simulated voltage-charge curve 301 that models the lithium plating is in accord with the determined voltage-charge curve 200 within the limits of error, it can be concluded that lithium plating is present in the battery.

Methods for ascertaining the voltage-charge curve as described in connection with FIGS. 10 to 12 can further make it possible to quantify the lithium plating. This can, for example, be done quantitatively by quoting the width 810 of FIG. 11.

Figure 13:
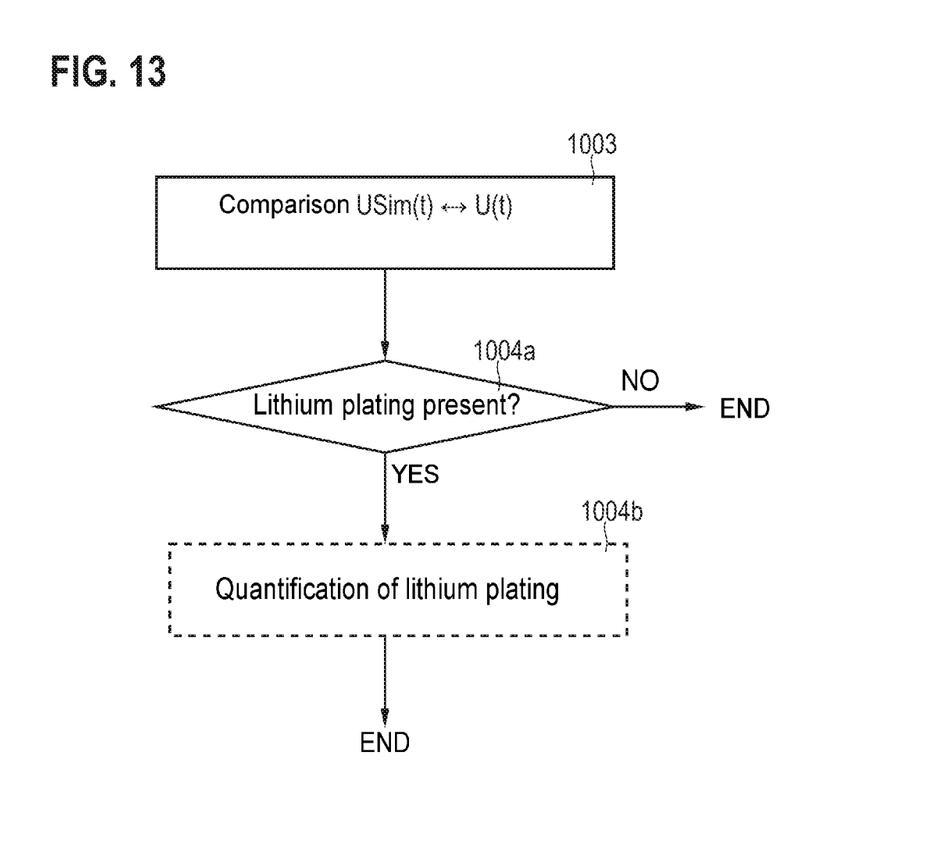
FIG. 13 shows possible method steps in the method of FIG. 1.

FIG. 13 shows possible method steps in the method of FIG. 1.

A comparison of USim(t) with U(t) takes place at 1003 in the variant of FIG. 13. This can, for example, be done using voltage-charge curves, as described in connection with FIGS. 10 to 12. Other procedures are, however, also possible.

A determination 1004a of whether lithium plating is present in the battery is now made on the basis of the comparison 1003. If this is not the case, the algorithm ends. The information that no lithium plating is present can be stored and/or forwarded.

If lithium plating is present, the algorithm can also be ended, in which case the information that lithium plating is present can be stored and/or forwarded. In addition, a quantification of the lithium plating, as described above, can take place at 1004b. The quantification of the lithium plating can also be stored and/or forwarded. The algorithm ends thereafter.

The features of the exemplary embodiments and aspects of the invention described above can, of course, be combined with one another. In particular, the features can be used not only in the combinations described, but also in other combinations, or on their own, without leaving the scope of the invention.

For example, various techniques associated with a determination of lithium plating for a battery have been described above. Such techniques can also be implemented for individual blocks of the battery, or cells, or cell groups of the battery.

Various techniques have furthermore been described above in which operating values are received as time-series. In general, however, it would also be possible for the operating values to be received as aggregated data, i.e. for example as histograms. The processes described above can also be carried out with such aggregated data. For this purpose, aggregated data can also be formed from simulated variables, and the aggregated, simulated data compared with the aggregated measured data. In addition or alternatively, time-series can be deduced again from aggregated data. Time-series can, for example, be reconstructed from aggregated data, for example in that reference time-series are determined for a first set of reference devices during test cycles and/or field use, and aggregated reference data derived from these time-series can be determined. Aggregated data can then, for example, be collected for a second set of devices, and by comparing aggregated data with the aggregated reference data on the basis of reference time-series, reconstructed time-series can be determined. The methods described here can then be carried out with the reconstructed time-series. Other procedures, or modified procedures, are also possible. Such procedures can offer the advantage that only a low proportion of devices, for example less than 1% of a vehicle series, needs to be configured to acquire time-series, but individual battery states of the other vehicles of the series can also be inferred, on the basis, for example, of aggregated data retrieved at servicing intervals.

The invention claimed is:

1. A method for preventing lithium plating of a second rechargeable battery, comprising:
    receiving operating values of a first battery as time-series, wherein the operating values are associated with a first operation of the first battery, and wherein the operating values comprise:
        a terminal voltage of the first battery,
        a battery current of the first battery,
    determining a simulated terminal voltage using a model of the first battery on the basis of the battery current,
    calculating a difference between the simulated terminal voltage and the terminal voltage, determining a lithium plating state of the first battery on the basis of the difference, generating transmittable control data based on the lithium plating state of the first battery for preventing lithium plating of the second battery that has characteristics in common with the first battery, transmitting the control data to the second battery via a communication connection, and causing the second battery to apply the control data to control a second operation, wherein the control data comprises one or more operating limits based on the difference to reduce or avoid a progress of the lithium plating during the second operation.

2. The method as claimed in claim 1, wherein calculating the difference comprises:

determining a voltage-charge curve on the basis of the terminal voltage and the battery current, determining a simulated voltage-charge curve on the basis of the simulated terminal voltage and the battery current, calculating a difference between the voltage-charge curve and the simulated voltage-charge curve.

3. The method as claimed in claim 2, wherein the calculation of the difference between the simulated terminal voltage and with the terminal voltage is further based on a voltage offset between the simulated terminal voltage and the terminal voltage, or the simulated terminal voltage is based on a voltage offset and wherein the determination of the lithium plating state is quantified on the basis of a width of a plateau of the voltage-charge curve, wherein the plateau is determined on the basis of the voltage offset.

4. The method as claimed in claim 1, wherein the calculation of the difference between the simulated terminal voltage and the terminal voltage is based on a voltage offset between the simulated terminal voltage and the terminal voltage, or the simulated terminal voltage is based on a voltage offset.

5. The method as claimed in claim 4, wherein the voltage offset is between 50 mV and 150 mV.

6. The method as claimed in claim 4, wherein the voltage offset is between 80 mV and 120 mV.

7. The method as claimed in claim 1, wherein the terminal voltage and the battery current are ascertained during a discharging procedure and/or a charging procedure of the battery.

8. The method as claimed in claim 1, wherein the model of the battery comprises the following elements:

an equivalent circuit of the battery that comprises at least one resistor and an ideal voltage source, and wherein the method further comprises:

determining a dimensioning of at least one element of the model of the battery on the basis of at least one state variable of the battery.

9. The method as claimed in claim 8, wherein the model of the battery further comprises:

at least one RC network and/or at least one hysteresis element that is configured to model a hysteresis behavior of the battery.

10. The method as claimed in claim 1, wherein at least one element of the model of the battery depends on at least one state variable.

11. The method as claimed in claim 10, wherein the at least one state variable is selected from:
the temperature of the surroundings of the battery,
the temperature of the battery,
a state of charge, SoC, of the battery,
an ageing state of the battery,
an event history of the battery,
a current rate of a load of the battery.

12. The method as claimed in claim 1, wherein method additionally comprises:

provision of a configuration for a battery management system on the basis of the lithium plating state of the battery.

13. A non-transitory computer readable medium storing program code which, when executed on a processor, has the effect that the method as claimed in claim 1 is carried out.

14. A system, comprising:

at least one device with a battery, wherein the device is configured to transmit operating values to a server, wherein the operating values comprise:
a terminal voltage of the battery as a time-series, and a battery current of the battery as a time-series, and a server that is configured to receive the operating values of the at least one device and with them to carry out the method as claimed in claim 1.

15. A server that is configured to receive operating values of a battery as time-series and with them to carry out a method as claimed in claim 1.

16. A method for preventing lithium plating of a rechargeable battery, comprising:

receiving operating values of a first battery as time-series, wherein the operating values are associated with a first operation of the first battery, and wherein the operating values comprise:
a terminal voltage of the first battery,
a battery current of the first battery, determining a simulated terminal voltage using a model of the first battery on the basis of the battery current, calculating a difference between the simulated terminal voltage and the terminal voltage, determining a lithium plating state of the first battery on the basis of the difference, generating transmittable control data based on the lithium plating state of the first battery for preventing lithium plating of the first battery in a second operation of the first battery or of a second battery that has characteristics in common with the first battery, transmitting the control data from a server to a device comprising a battery controller controlling the second operation of the first or the second battery, and causing the first or the second battery to apply the control data to control the second operation, wherein the control data comprises one or more operating limits based on the difference to reduce or avoid a progress of the lithium plating during the second operation.

* * * * *